(12) United States Patent
Lee

(10) Patent No.: US 7,691,709 B2
(45) Date of Patent: Apr. 6, 2010

(54) METHOD OF FABRICATING FLASH MEMORY USING METAL-OXIDE-CRYSTAL CHARGE TRAP

(75) Inventor: Hye-Sung Lee, Seoul (KR)

(73) Assignee: Dongbu HiTek Co., Ltd, Seoul (KR)

( * ) Notice: Subject to any disclaimer, the term of this patent is extended or adjusted under 35 U.S.C. 154(b) by 104 days.

(21) Appl. No.: 11/873,963

(22) Filed: Oct. 17, 2007

(65) Prior Publication Data

US 2008/0150046 A1 Jun. 26, 2008

(30) Foreign Application Priority Data

Dec. 21, 2006 (KR) ...................... 10-2006-0131494

(51) Int. Cl.
*H01L 29/94* (2006.01)
*H01L 21/336* (2006.01)
(52) U.S. Cl. ................ 438/261; 257/411; 257/E29.132
(58) Field of Classification Search ................ 257/411, 257/E29.132; 438/261
See application file for complete search history.

(56) References Cited

U.S. PATENT DOCUMENTS 6,054,349 A * 4/2000 Nakajima et al. ........... 438/257
7,112,842 B2 * 9/2006 Chae et al. .................. 257/321
7,303,959 B2 * 12/2007 Herner ........................ 438/261
7,495,284 B2 * 2/2009 Lee ............................ 257/324
2005/0202639 A1 * 9/2005 Yoo et al. .................... 438/283
2006/0081948 A1 * 4/2006 Lim et al. ................... 257/410
2006/0273377 A1 * 12/2006 Chae et al. .................. 257/321
2008/0085583 A1 * 4/2008 Park et al. ................... 438/261
2008/0254606 A1 * 10/2008 Baek et al. .................. 438/585

FOREIGN PATENT DOCUMENTS

KR 10-2005-0000969 * 1/2005
KR 1020050000969 A 1/2005

* cited by examiner

*Primary Examiner*—Matthew Smith
*Assistant Examiner*—Walter H Swanson
(74) *Attorney, Agent, or Firm*—Sherr & Vaughn, PLLC

(57) ABSTRACT

A method of fabricating a flash memory includes forming a first oxide film over a semiconductor substrate, forming a metal film over the first oxide film, forming a photoresist pattern on the metal film, etching the metal film using the photoresist pattern as a mask and forming a metal film pattern, forming a second oxide film overlying the metal film pattern, and heat-treating the first and second oxide films at high temperature and processing the metal film pattern using metal oxide crystallization.

13 Claims, 3 Drawing Sheets

US 7,691,709 B2

METHOD OF FABRICATING FLASH MEMORY USING METAL-OXIDE-CRYSTAL CHARGE TRAP

Figure 1:
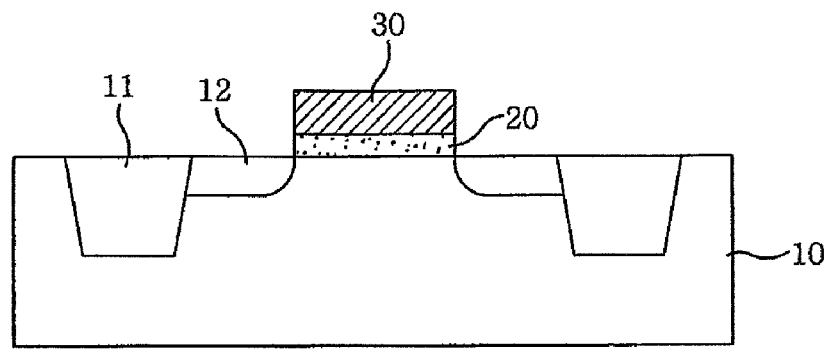

The present application claims priority under 35 U.S.C. 119 to Korean Patent Application No. 10-2006-0131494 (filed on Dec. 21, 2006) which is hereby incorporated by reference in its entirety.

BACKGROUND

Flash memory may be a non-volatile memory medium having electrical data incapable of being erased although the flash memory is powered off. For semiconductor devices having high integration, a small-sized flash memory may be obtained. The floating gate (FG) of such a small-sized flash memory, in turn, may have a simple structure. Particularly, for semiconductor devices of 100 nm or less, the simplification of a floating gate is important since channel width is reduced.

Flash memory can be advantageous for exhibiting high data processing such as recording, reading, and erasing. Accordingly, flash memory is suitable for applications for basic I/O system (BIOS) for personal computer (PC) and data storage for a desk top box, a printer, a network server, and the like. Flash memory is also suitable for digital cameras, portable phones, and the like.

Flash memory has certain disadvantages such as high operational voltage of about 9V to 12V. It can be difficult to reduce the operational voltage without a reduction in other functions and without reducing reliability. Moreover, fabricating a flash memory that can be driven at low voltages of 5V or less using an oxide-nitride-oxide (ONO) structure can be difficult.

Such low operational voltages may be achieved through the use of flash memory fabrication processes involving nano-dot or nano-crystal structures. The density of nano-dot structures leads to differences in information storage capability of flash memory and thus, great density is desirable. However, small gaps between nano-dots may cause increases in leakage current and also a reduction in maintenance time. Accordingly, controlling the gap between nano-dots is important to fabricating a flash memory having a low operational voltage.

SUMMARY

Embodiments relate to a method of fabricating a flash memory that can be driven at low voltages using a uniform metal oxide crystal within an oxide film.

In accordance with embodiments, a method of fabricating a flash memory may include at least one of the following steps. Forming a first oxide film on and/or over a semiconductor substrate. Forming a metal film on and/or over the first oxide film. Forming a photoresist pattern on and/or over the metal film. Etching the metal film using the photoresist pattern as a mask and forming a metal film pattern. Forming a second oxide film including the metal film pattern. Heat-treating the first and second oxide films at a predetermined temperature and processing the metal film pattern by metal oxide crystallization.

In accordance with embodiments, a flash memory may include a semiconductor substrate, a first oxide film formed on and/or over the semiconductor substrate, a second oxide film formed on and/or over the first oxide film and burying a metal oxide crystal, and a gate formed on and/or over the second oxide film.

DRAWINGS

Example FIGS. 1 to 6 illustrate a method of fabricating a flash memory, in accordance with embodiments.

Figure 7:
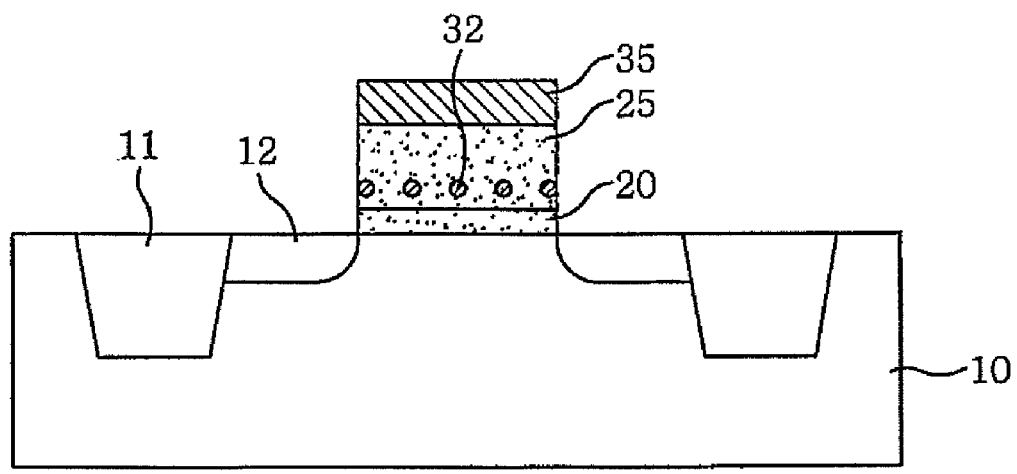

Example FIG. 7 illustrates a flash memory, in accordance with embodiments.

Figure 8:
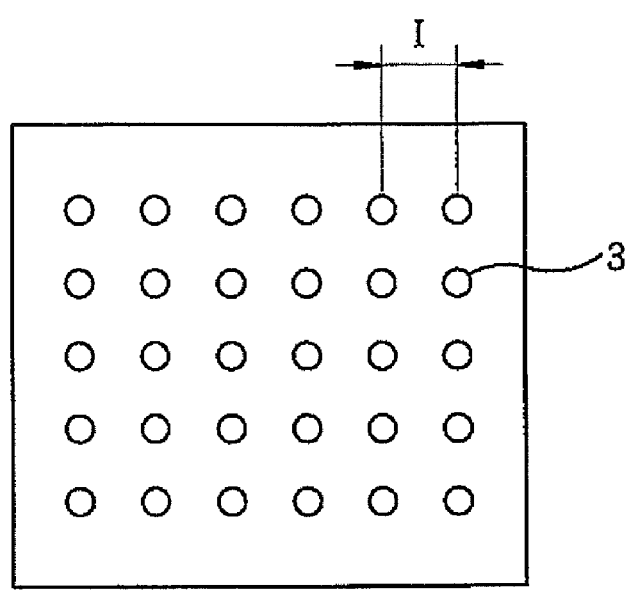

Example FIG. 8 illustrates a mask with a dot pattern formed.

DESCRIPTION

In accordance with embodiments, each layer (film), region, pattern, or structure can be formed "on/above/over/upper" or "down/below/under/lower" than each layer (film), region, pad, or pattern is intended to mean that each layer (film), region, pad, or structure is formed in direct contact with each layer (film), region, pad, or pattern. Alternately, in accordance with embodiments, it is intended that a different layer (film), a different region, a different pad, a different pattern, or a different structure is additionally formed therebetween.

As illustrated in example FIG. 1, device isolation film 11 and source/drain region 12 can be formed in semiconductor substrate 10. First oxide film 20 can then be formed on and/or over semiconductor substrate 10 which can include a silicon wafer. Semiconductor substrate 10 can be a P-type semiconductor substrate or an N-type semiconductor substrate. The P-type semiconductor substrate can be formed using low-concentration ion doping of P-type dopants. The N-type semiconductor substrate can be formed using low-concentration ion doping of N-type dopants. First oxide film 20 can be formed through oxidation of semiconductor substrate 10 and have a thickness in a range between approximately 60 Å to 100 Å.

Metal film 30 can be formed on and/or over first oxide film 20. Metal film 30 may be at least one of a nickel film, a titanium film, and a cobalt film. Metal film 30 may be formed having a thickness range of approximately 40 Å to 60 Å. Metal film 30 may be formed having a thickness of about 50 Å.

Figure 2:
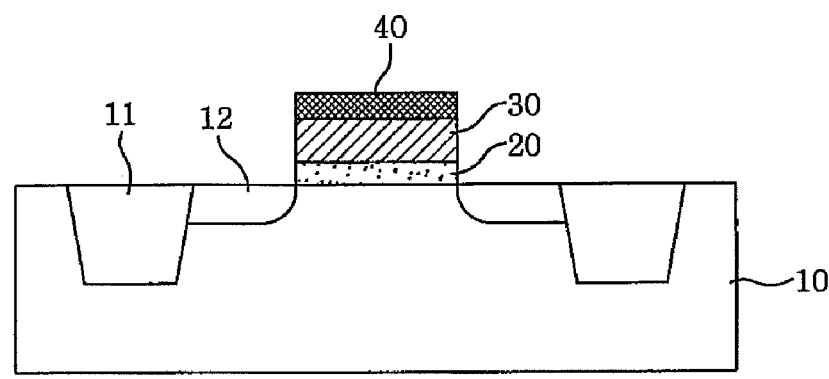
Figure 3:
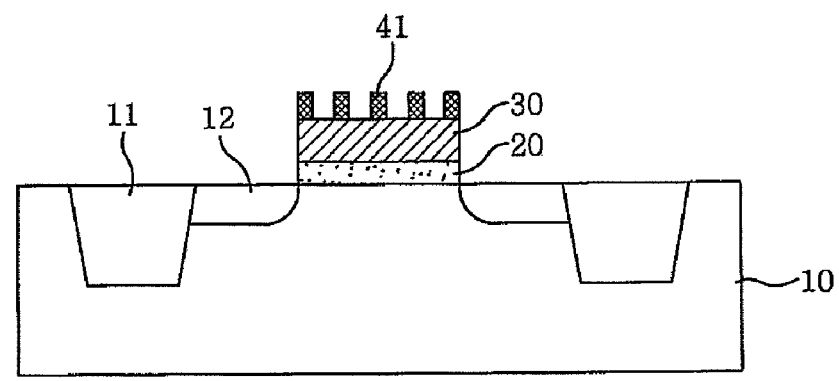

As illustrated in example FIG. 2, photoresist film 40 can be coated on and/or over metal film 30. Photoresist film 40 may be a positive or negative photoresist film. As illustrated in example FIG. 3, photoresist film 40 may then be projected and exposed with a photoresist pattern using exposure equipment such as a stepper to form photoresist pattern 41. Photoresist pattern 41 may alternatively be formed using ion implantation without exposure and developing.

As illustrated in example FIG. 8, photoresist pattern 41 may use a mask having dot pattern 3 to form a substantially circular-shaped metal film pattern having a diameter of approximately 100 Å to 500 Å in a subsequent process. Meaning, dot pattern 3 can be formed such that its diameter is within a range of about 100 Å to 500 Å and an inter-pattern interval (I) can be greater than at least the diameter of dot pattern 3.

Figure 4:
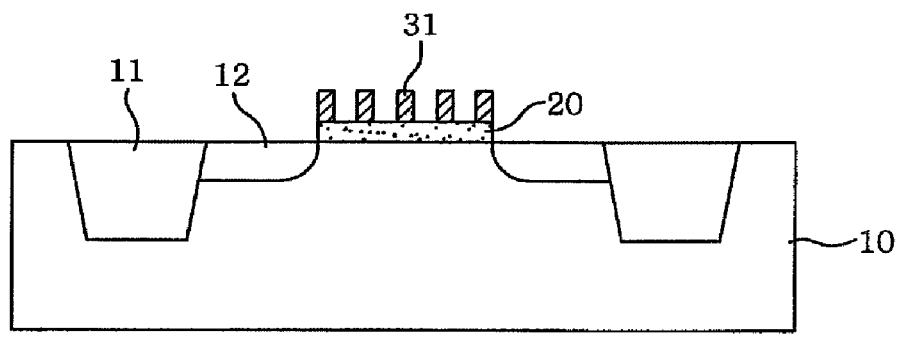

As illustrated in example FIG. 4, metal film 30 can be etched using photoresist pattern 41 as a mask to form metal film pattern 31. By the photoresist pattern 41 having the dot pattern (D), the metal film pattern 31 is formed to have a diameter of about 100 Å to 500 Å. An interval between the metal film patterns 31 is within a range of at least 100 Å to 500 Å or more. After that, the photoresist pattern 41 is removed.

Figure 5:
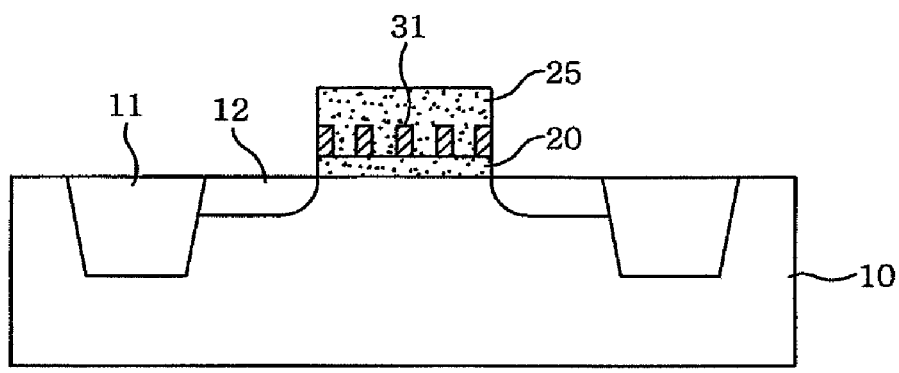

As illustrated in example FIG. 5, second oxide film 25 can be formed on and/or over first oxide film 20 on which metal film pattern 31 is formed. Thus, the metal film pattern 31 is included within the second oxide film 25. Second oxide film 25 can be formed by growing first oxide film 20 or by a separate oxide film deposition process.

Figure 6:
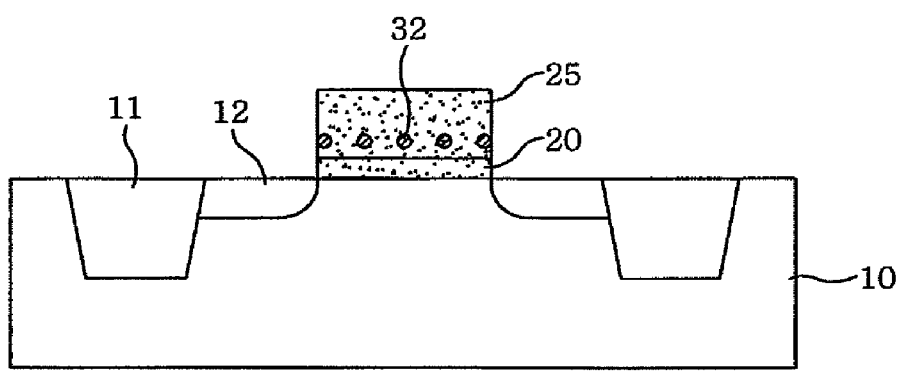

As illustrated in example FIG. 6, first oxide film 20 and second oxide film 25 including the metal film pattern 31 can be heat-treated at a high temperature and oxidized. Oxidation of metal film pattern 31 leads to formation of a plurality of metal oxide crystals 32 having a uniform density and size. Finally, gate 35 may be formed on and/or over second oxide film 25.

As illustrated in example FIG. 7, device isolation region 11 and source/drain regions 12 can be formed in semiconductor substrate 10. A channel region can be formed between source/drain regions 12. Source/drain regions 12 can be low concentration source/drain regions and high concentration source/drain regions.

First oxide film 20 can be formed on and/or over semiconductor substrate 10. Second oxide film 25 in which a plurality of metal oxide crystals 32 is buried can be formed on and/or over first oxide film 20. Metal oxide crystal 32 can be at least one of nickel (Ni), titanium (Ti), and cobalt (Co). Metal oxide crystal can have a diameter range of between approximately 100 Å to 500 Å. Metal oxide crystals 32 can be formed such that an interval or gap (I) between metal oxide crystals 32 is greater than at least the diameter of metal oxide crystals 32. Accordingly, it can be greater than at least 100 Å to 500 Å. Gate 35 can be formed on and/or over second oxide film 25. Gate 35 can be a floating gate.

In a flash memory fabricated in accordance with embodiments, driving can occur even at low voltages by forming a uniform metal oxide crystal within the oxide film using a photolithography process. Formation of a plurality of metal oxide crystals 32 within second oxide film 25 may be used to serve as a deep-level trap center. Metal oxide crystals 32 may also have a uniform density and size and a contact prevention interval by patterning and high-temperature heat-treatment. Such a configuration can minimize, reduce or otherwise prevent occurrences of leakage current between metal oxide crystals 32.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a first oxide film over a semiconductor substrate;
   forming a metal film over the first oxide film;
   forming a photoresist pattern over the metal film;
   etching the metal film using the photoresist pattern as a mask, and forming a metal film pattern;
   forming a second oxide film overlying the metal film pattern; and
   oxidizing the first oxide film and the second oxide film overlying the metal film pattern by heat-treating the first and second oxide films and processing the metal film pattern using metal oxide crystallization.

2. The method of claim 1, wherein the photoresist pattern is a negative photoresist pattern composed of a negative photoresist.

3. The method of claim 1, wherein the metal film comprises at least one of nickel, titanium and cobalt.

4. The method of claim 1, wherein the metal film has a thickness in a range between 40 Å to 60 Å.

5. The method of claim 1, wherein the metal film pattern has a diameter in a range between 100 Å to 500 Å.

6. A method comprising:
   forming a device isolation film and a source/drain region in a semiconductor substrate;
   forming a first oxide film over the semiconductor substrate;
   forming a metal film over the first oxide film;
   coating a photoresist film over the said metal film;
   forming a photoresist pattern;
   forming a metal film pattern having a dot pattern using the photoresist pattern as a mask;
   removing the photoresist pattern;
   forming a second oxide film over the first oxide film;
   heat treating the first oxide film and the second oxide film;
   forming a plurality of metal oxide crystals within the second oxide film; and
   forming a gate over the second oxide film,
   wherein the second oxide film overlies the metal film pattern, and
   wherein forming the plurality of metal oxide crystals comprises oxidizing the first oxide film and the second oxide film overlying said metal film pattern.

7. The method of claim 6, wherein the first oxide film has a thickness in a range between 60 Å to 100 Å.

8. The method of claim 6, wherein the metal film comprises at least one of nickel, titanium, and cobalt.

9. The method of claim 8, wherein the metal film has a thickness in a range between approximately 40 Å to 60 Å.

10. The method of claim 6, wherein forming the photoresist pattern comprises exposing and projecting the photoresist film.

11. The method of claim 6, wherein forming the photoresist pattern comprises ion implantation.

12. The method of claim 6, wherein the metal film pattern is substantially circular-shaped.

13. A method comprising:
    forming a device isolation film and a source/drain region in a semiconductor substrate;
    forming a first oxide film over the semiconductor substrate;
    forming a metal film over the first oxide film;
    coating a photoresist film over the said metal film;
    forming a photoresist pattern;
    forming a metal film pattern having a dot pattern using the photoresist pattern as a mask;
    removing the photoresist pattern;
    forming a second oxide film over the first oxide film;
    heat treating the first oxide film and the second oxide film;
    forming a plurality of metal oxide crystals within the second oxide film; and
    forming a gate over the second oxide film,
    wherein the gate comprises a floating gate.

* * * * *